US008927881B2

(12) United States Patent
Wittenberg et al.

(10) Patent No.: US 8,927,881 B2

(45) Date of Patent: Jan. 6, 2015

(54) INSERT MOLDED COWLING STRUCTURES

(75) Inventors: Michael B. Wittenberg, Sunnyvale, CA (US); Sawyer I. Cohen, Sunnyvale, CA (US); Jared M. Kole, San Francisco, CA (US); Shayan Malek, San Jose, CA (US); David A. Pakula, San Francisco, CA (US); Ashutosh Y. Shukla, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 13/607,440

(22) Filed: Sep. 7, 2012

(65) Prior Publication Data

US 2014/0071651 A1 Mar. 13, 2014

(51) Int. Cl.
*H05K 7/14* (2006.01)

(52) U.S. Cl.
USPC .......................... 174/535; 361/812; 455/575.1

(58) Field of Classification Search
USPC ......... 174/377, 382, 535; 361/812; 455/575.1
See application file for complete search history.

(56) References Cited

U.S. PATENT DOCUMENTS 5,367,437 A * 11/1994 Anderson ..................... 361/807
7,292,459 B2 * 11/2007 Wang ............................ 361/818
2002/0071940 A1 * 6/2002 Arnold et al. ................. 428/195
2009/0244878 A1 * 10/2009 Wurzel et al. ................. 361/818
2009/0266602 A1 * 10/2009 Tseng ........................... 174/377
2009/0278282 A1 11/2009 Lee et al.
2009/0283319 A1 * 11/2009 Hsieh ............................ 174/350
2011/0255850 A1 10/2011 Dinh et al.
2011/0256310 A1 10/2011 Lee et al.
2012/0176755 A1 7/2012 Malek et al.
2012/0230003 A1 * 9/2012 Stevenson et al. ............ 361/816
2013/0077282 A1 3/2013 Malek et al.

* cited by examiner

*Primary Examiner* — Hung V Ngo

(74) *Attorney, Agent, or Firm* — Treyz Law Group; Kandall P. Woodruff

(57) ABSTRACT

Electronic devices may be provided with electronic components and cowling structures that secure the electronic components. A cowling structure may include a metal portion and an insulating portion that has been insert-molded onto the metal portion. The metal portion and the insert-molded insulating portion may each have an opening that receives a screw. The screws may pass through the respective opening and attach to a substrate. The substrate may be a transparent cover layer for a device display. The cowling structure may press the electronic components against the transparent substrate layer. The device may include an antenna. The insert-molded insulating portion may extend from an edge of the metal portion in the direction of the antenna. The insert-molded insulating portion may prevent one of the screws from forming an electrical connection with the metal portion.

20 Claims, 12 Drawing Sheets

INSERT MOLDED COWLING STRUCTURES

BACKGROUND

This relates generally to mechanical structures, and, more particularly, to mounting structures that support electronic components in electronic devices.

Electronic devices are commonly provided with electronic components and mounting structures that secure the electronic components in place. In some situations, a metal cowling structure may be mounted over an electronic component that holds the component in place. Electronic devices also include wireless communications circuitry such as antennas that are mounted in close proximity to other electronic components, particularly in compact devices.

It can be difficult to secure electronic components using a metal cowling in devices having antennas without risking electromagnetic interference from the metal cowling.

It would therefore be desirable to be able to provide improved mounting structures such as cowling structures for electronic devices.

SUMMARY

Mounting structures such as cowling structures having metal portions and insert-molded insulating portions may be provided. A mounting structure may be mounted over one or more electronic components in an electronic device. The insert-molded insulating portion may be an insert-molded plastic portion.

An electronic device may include wireless communications circuitry such as one or more antennas. The electronic components may be mounted within a housing for the device and in close proximity to an antenna.

The plastic portion of the mounting structure may extend from an edge of the metal portion toward the antenna thereby helping to prevent the metal portion from interfering with the operation of the antenna. The metal portion of the cowling structure may be a drawn metal structure that is free from any folded features.

The insert-molded plastic portion may be molded over protrusions on an edge of the metal portion. The insert-molded plastic portion may include a drilled hole having a beveled edge that receives an attachment member that secures the cowling structure to a substrate.

Further features of the invention, its nature and various advantages will be more apparent from the accompanying drawings and the following detailed description.

DETAILED DESCRIPTION

Electronic devices may be provided with electronic components and mounting structures for securing the electronic components. The mounting structures may include a cowling structure such as an insert-molded metal cowling structure that includes a metal portion and an insert-molded plastic portion. The insert-molded plastic portion may be molded onto engagement features on the metal portion and may be mounted adjacent to an antenna for the device to prevent the metal portion of the structure from interfering with antenna performance.

Figure 1:
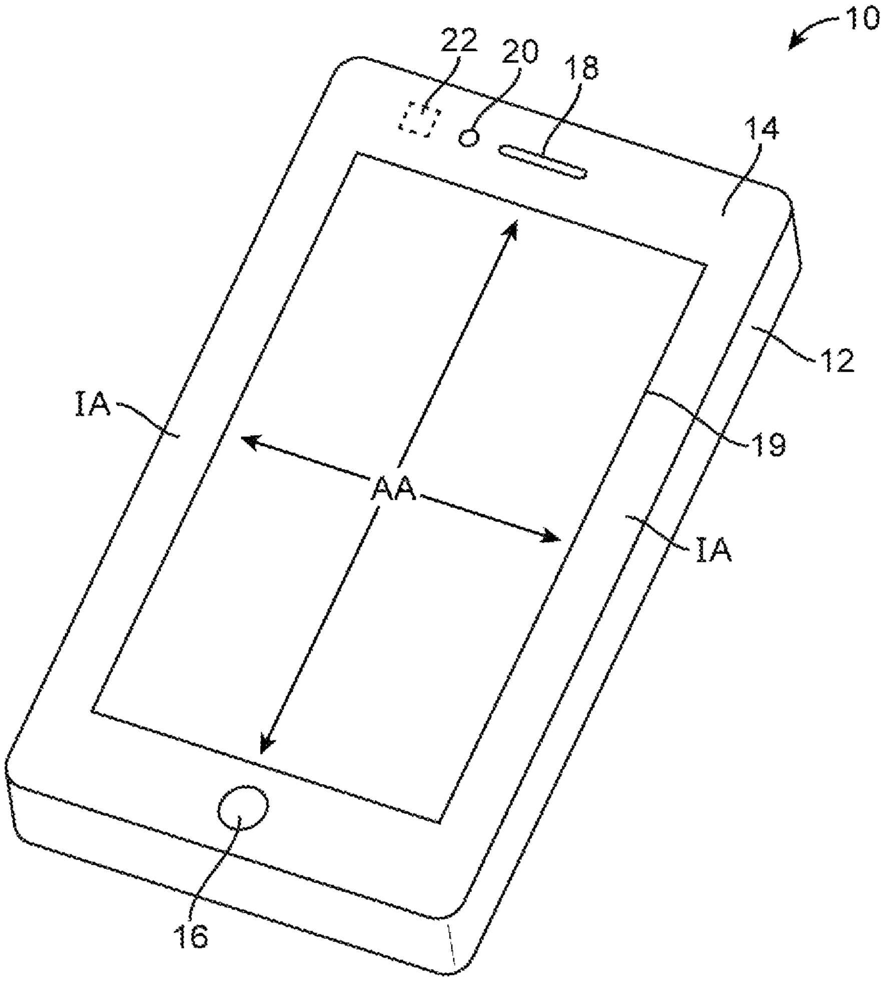
FIG. 1 is a perspective view of an illustrative electronic device with an insert-molded cowling structure in accordance with an embodiment of the present invention.

An illustrative electronic device that may be provided with insert-molded cowling structures is shown in FIG. 1. FIG. 1 shows how electronic device 10 may be a handheld device such as a cellular telephone, music player, gaming device, navigation unit, or other compact device. In this type of configuration for device 10, device 10 may include housing 12 having opposing front and rear surfaces and a peripheral edge portion (sometimes referred to as a band).

Device 10 may have one or more displays such as display 14. Display 14 may be a liquid crystal display, an organic light-emitting diode (OLED) display, or other suitable display. Display 14 may include display pixels formed from light-emitting diodes (LEDs), organic light-emitting diodes (OLEDs), plasma cells, electronic ink elements, liquid crystal display (LCD) components, and/or other suitable display pixel structures. Display 14 may, if desired, include capacitive touch sensor electrodes for a capacitive touch sensor array or other touch sensor structures (i.e., display 14 may be a touch screen).

Display 14 may be mounted on a front face of housing 12. Display 14 may, if desired, have a display cover layer such as a glass layer, plastic layer, or other exterior layer that forms a portion of an enclosure for device 10. An outer display cover layer may include openings for components such as button 16 and for speaker port 18.

Display 14 may be characterized by an active region such as rectangular active region AA and an inactive region such as peripheral inactive region IA. Rectangular active region AA may be bounded by rectangular border 19. Inactive region IA may have the shape of a rectangular ring that surrounds the periphery of active region AA. If desired, some of the edges of display 14 may be borderless (i.e., the width of the inactive region on one or more edges may be zero or may be negligibly small). The illustrative configuration of FIG. 1 in which display 14 is surrounded by an inactive border region is merely illustrative.

The underside of a display cover layer in inactive area IA may be provided with an opaque masking layer such as a layer of black ink to help hide internal components such as components 22 (e.g., wireless communications circuitry such as antennas, speaker circuitry, camera circuitry, or other components) from view by a user of device 10. If desired, openings may be provided in the opaque masking layer to allow light to reach camera 20 through the cover layer or other light-sensing components mounted under a cover layer for display 14.

Device 10 may have a housing enclosure such as housing 12. Electronic components 22 may be mounted within housing 12. Housing 12, which is sometimes referred to as a case or enclosure, may be formed of materials such as plastic, glass, ceramics, carbon-fiber composites and other composites, metal, aluminum, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures such as glass or plastic portions that have been mounted to internal frame elements or external housing members such as a peripheral band that runs around an edge of device 10).

The configuration for device 10 shown in FIG. 1 is merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Figure 2:
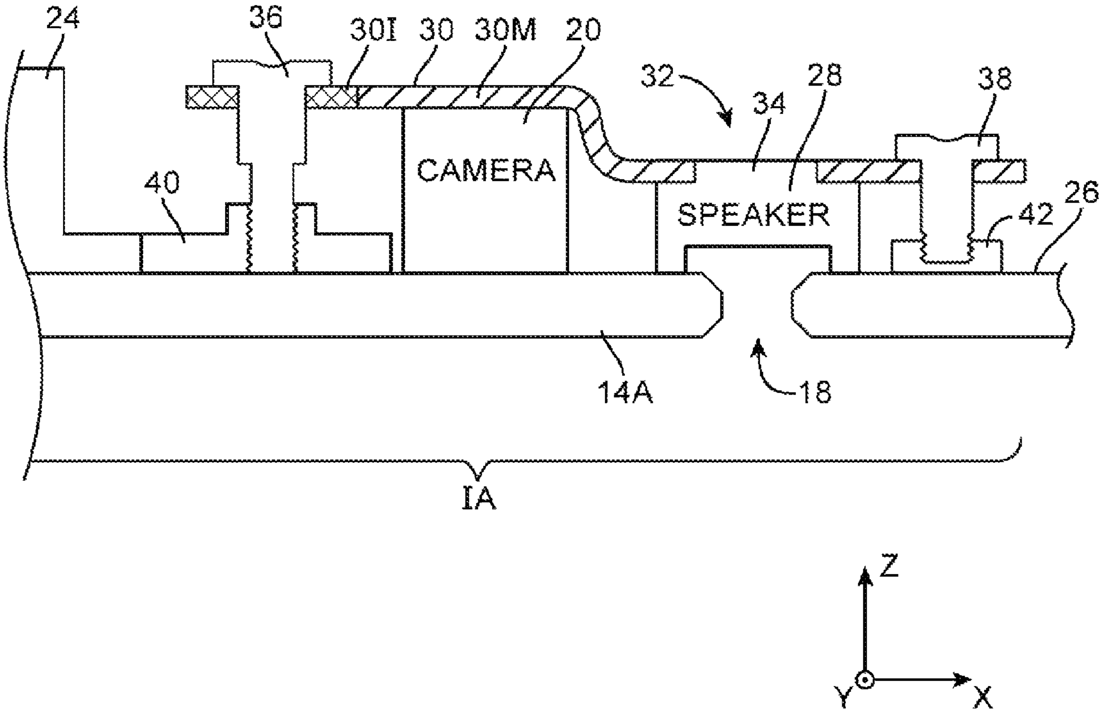
FIG. 2 is a cross-sectional side view of a portion of an illustrative electronic device showing how an insert-molded cowling structure may include a metal portion and an insert-molded insulating portion mounted adjacent to an antenna in accordance with an embodiment of the present invention.

As shown in FIG. 2, device 10 may include electronic components such as antenna 24, camera 20, and speaker 28 mounted against a portion of an outer cover layer such as display cover layer 14A in inactive area IA of device 10. Cover layer 14A may be a layer of transparent material such as glass or transparent plastic.

Inner surface 26 of cover layer 14A in inactive area IA may be covered by an opaque masking layer (not shown) such as a layer of black ink. If desired, one or more openings in the black ink layer may be provided that allow light to pass through portions of layer 14A onto camera 20. Speaker port 18 may be an opening such a hole in cover layer 14A that allows sound to pass from speaker 28 through layer 14A and to a user of device 10. Speaker 28 may sometimes be referred to herein as a receiver such as a telephone receiver. Other components such as antenna 24 may be hidden from view behind the black ink layer on inner surface 26.

Because the successful operation of components such as camera 20 and speaker 28 can depend on the precise positioning of those components within the device (e.g., the camera position with respect to an opening in a masking layer or the speaker position with respect to the speaker port opening in a cover layer) in can be desirable to resiliently constrain these components. Device 10 may include a support structure for securing electronic components such as cowling structure 30.

Cowling structure 30 may have a shape and a position that constrains components such as camera 20 and speaker 28 in position by exerting a force that presses camera 20 and speaker 28 against cover layer 14A. As shown in FIG. 2, cowling structure 30 may include one or more openings such as opening 32. Opening 32 may be a hole in cowling structure 30 that receives protruding portion 34 (sometimes referred to herein as a boss) on speaker 28. In this way, cowling structure 30 may constrain the movement of speaker 28 in a direction parallel to the x-y plane of FIG. 2 while providing a restraining force in a direction anti-parallel to the z-direction of FIG. 2.

Cowling structure 30 may be attached to cover layer 14A using attachment members such as screws 36 and 38. Screws 36 and 38 may be engaged with respective receiving members 40 and 42. Receiving members 40 and 42 may be formed from a rigid material such as metal having an opening such as a threaded hole for engaging with attachment members 36 and 38. Receiving members 40 and 42 may be attached to cover layer 14A using adhesive or other bonding materials, may be fused to cover layer 14A, or may be otherwise attached to layer 14A.

As shown in FIG. 2, cowling structure 30 may include metal portion 30M and an additional non-conductive (insulating) portion such as portion 30I that is insert molded onto metal portion 30M. For example, portion 30I may be a plastic portion that has been insert molded on to metal portion 30M. In this way, cowling structure 30 may be implemented as an insert-molded metal cowling structure.

Plastic portion 30I may include one or more openings that allow an attachment member such as screw 36 to pass through plastic portion 30I and engage with a receiving member such as member 40. Metal portion 30M may include one or more openings that allow an attachment member such as screw 38 to pass through metal portion 30M and engage with a receiving member such as member 42.

As shown in FIG. 2, plastic portion 30I may be an extended portion that extends from an edge of metal portion 30M beyond camera 20 in the direction of antenna 24. By providing cowling structure 30 with plastic portion 30I, metal portion 30M may be prevented from interfering with the operation of antenna 24. Plastic portion 30I may also prevent a conductive connection from forming that passes from member 40 through screw 36, structure 30, and screw 38 to member 42 that could act as an interfering structure for antenna 24.

Cowling structure 30 may be formed from materials that allow cowling structure 30 to flex by small amount and return to its original shape (e.g., in the event that device 10 is dropped by a user or experiences another impact) so that camera 20 and/or speaker 28 may not be permanently dislodged or unattached from surface 26 in such an event. In this way, a cowling structure such as cowling structure 30 may provide a damping action in a drop event creating a lower natural frequency for components such as camera 20 and speaker 28 that results in a relatively smaller impulse being delivered to the components than in a device in which components are more rigidly attached to structures within the device.

Figure 3:
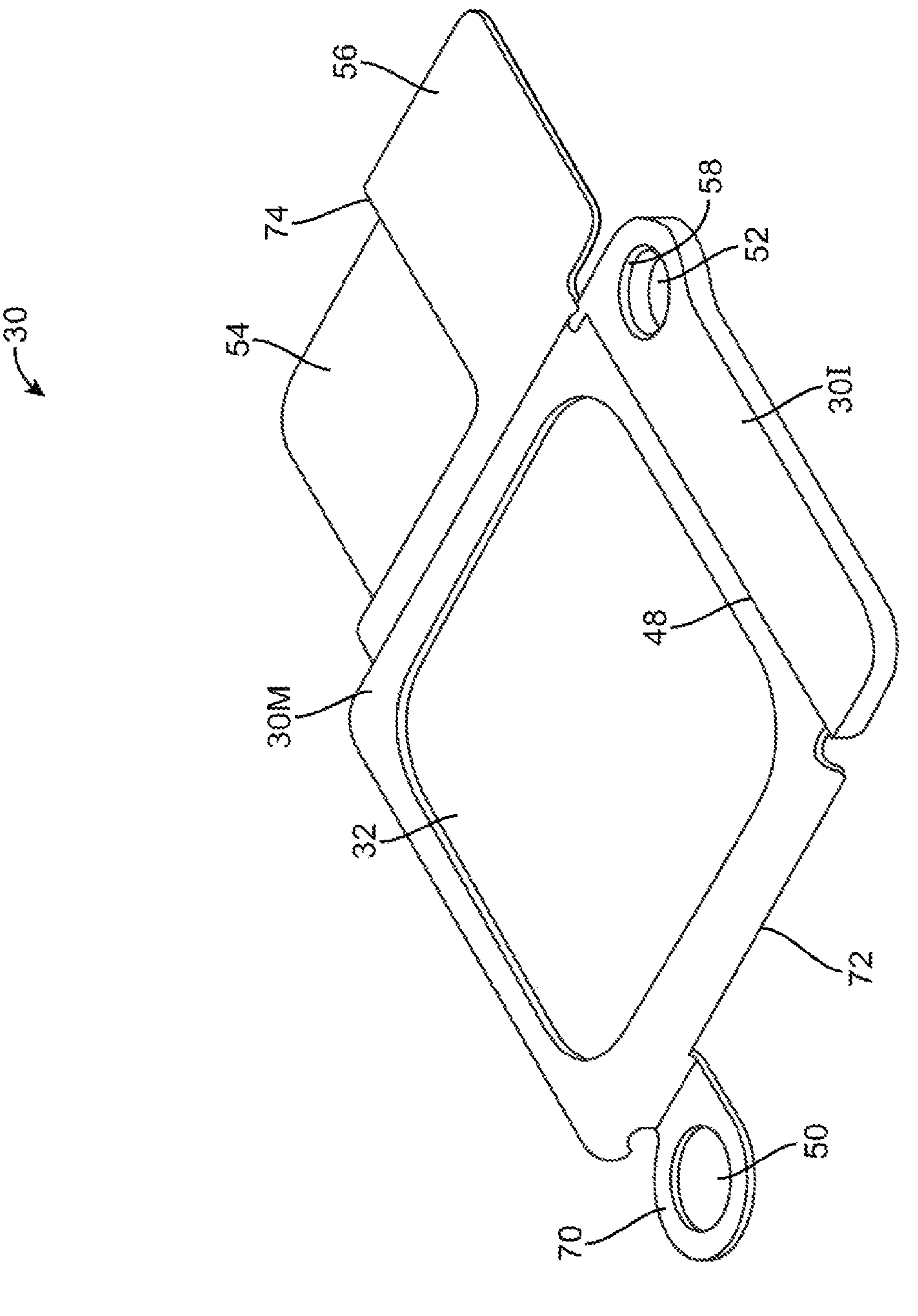
FIG. 3 is a perspective view of an illustrative insert-molded cowling structure in accordance with an embodiment of the present invention.

FIG. 3 is a perspective view of insert-molded cowling structure 30. As shown in FIG. 3, insert-molded plastic portion 30I may be formed along edge 48 of metal portion 30M. Metal portion 30M may include protrusions along edge 48 onto which plastic portion 30I has been molded.

Insulating portion 301 may include an opening such as hole 52. Hole 52 may allow screw 36 (FIG. 2) to pass through insulating portion 30I. Hole 52 may be provided with beveled edge 58 so that screw 36 provides an additional restraining force within a portion of hole 52 in a direction anti-parallel to the z-direction of FIG. 2.

Insulating portion 30I may be formed from plastic materials such as glass-filled reinforced plastic or may be formed from unfilled plastic (as examples). Metal portion 30M may be formed from stainless steel (as an example). If desired, metal portion 30M may include a conductive coating such as a nickel coating that improves the conductivity of an outer surface of metal portion 30M. If desired, a conductive structure such as a grounding spring for an antenna such as antenna 24 of FIG. 2 may be mounted in contact with portion 54 or portion 56 of metal portion 30M.

As shown in FIG. 3, metal portion 30M may include offset parallel planar portions such as portion 54 and 56 that are separated by curved (bent) portions such as portion 74. If desired, portion 54 or portion 56 may be used to providing a constraining force against a component such as camera 20. An opening such as opening 32 in metal portion 30M may be used to receive a protruding portion of a component such as boss 34 of speaker 28. Metal portion 30M may include openings such as circular opening 50. Circular opening 50 may be used to allow an attachment member such as screw 38 to pass through metal portion 30M.

Opening 50 may be formed on an extended portion such as portion 70 that is formed along a curved (bent) edge such as edge 72 or metal portion 30M. In this way, an opening for receiving a mounting screw may be formed in a different plane with respect to other portions of structure 30.

If desired, metal portion 30M may be a drawn metal structure that is free from folded portions. In this way, metal portion 30M may be formed with a relatively thinner thickness than a cowling structure with folded metal portions. However, this is merely illustrative. If desired, metal portion 30M may include one or more folded portions.

Figure 4:
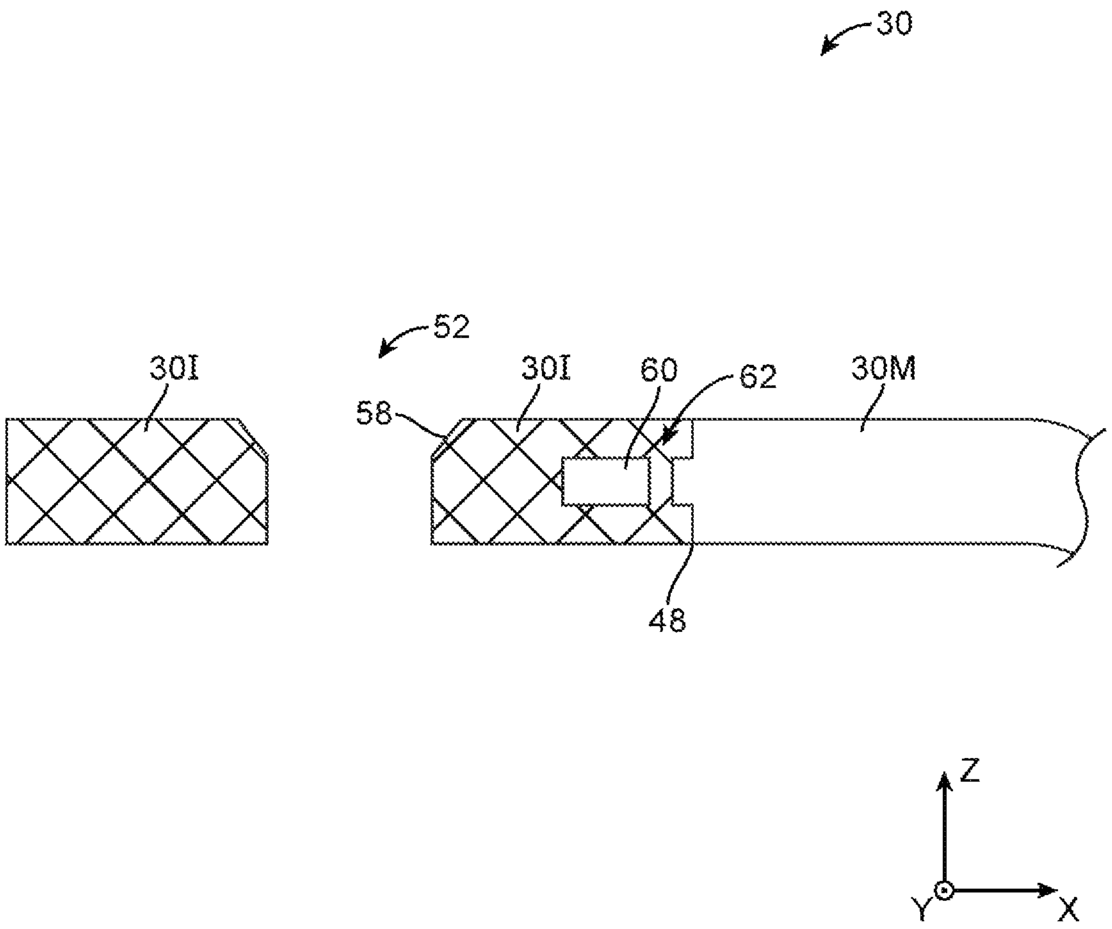
FIG. 4 is a cross-sectional side view of a portion of an illustrative insert-molded cowling structure showing how a plastic portion of the cowling may be insert molded onto engagement features on a metal portion of the cowling in accordance with an embodiment of the present invention.

As shown in the cross-sectional side view of structure 30 in FIG. 4, metal portion 30M of cowling structure 30 may include protruding portions such as portion 60 along edge 48. Protruding portions 60 may be used as engagement members onto which insulating portion 30I is molded. Protruding portion 60 may include openings such as opening 62 into which portions of insulating material 30I is formed during insert-molding operations. In this way, insulating portion 30I may be prevented from pulling away from edge 48 in a direction anti-parallel to the x-direction of FIG. 4.

Figure 5:
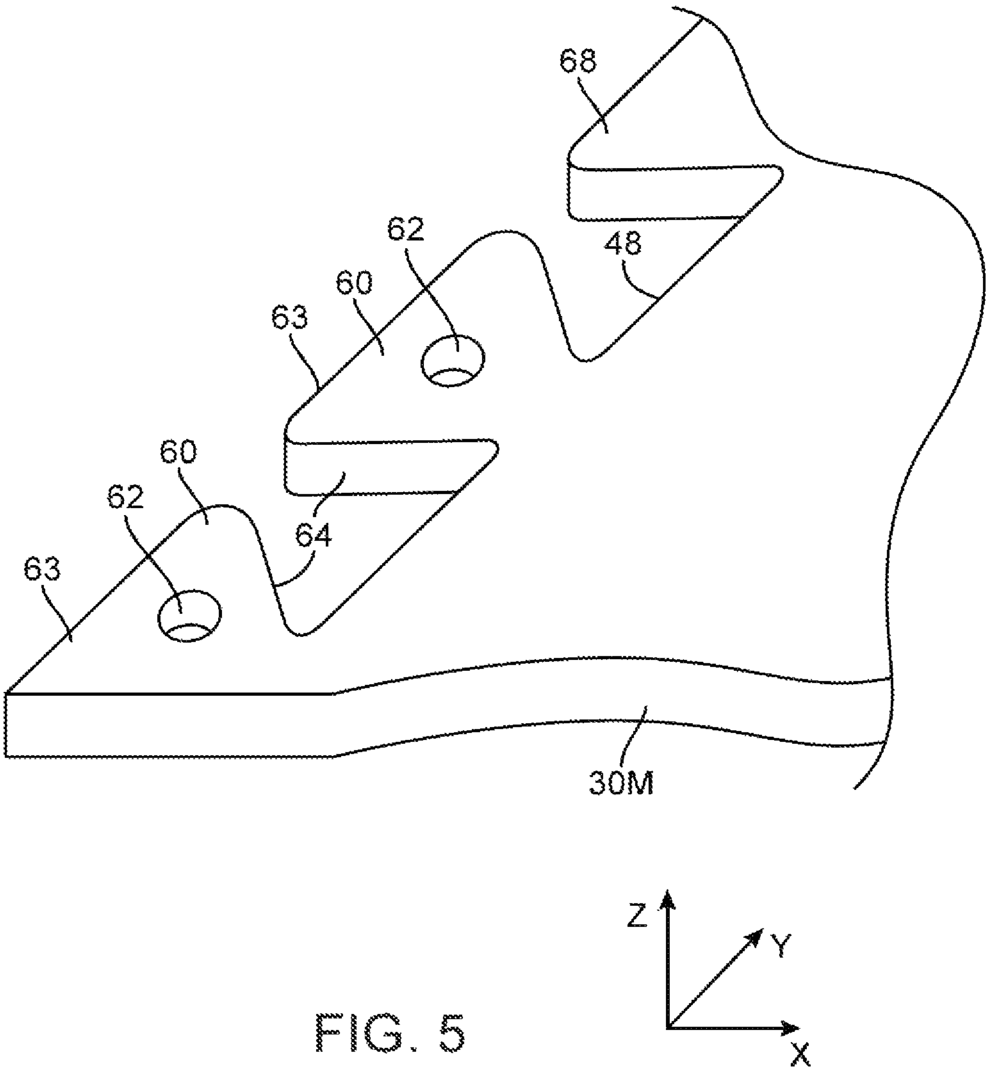
FIG. 5 is a perspective view of illustrative engagement features on an edge of a metal portion in accordance with an embodiment of the present invention.

FIG. 5 is a perspective view of illustrative protruding portions that may be formed along edge 48 of structure 30. As shown in FIG. 5, protruding portions 60 may include outer edges 63 that are parallel to edge 48 and angled edges 64 that are formed at an acute angle with respect to edge 48. Edges 64 may provide resistance to forces on insulating portion 30I (not shown) in the x-y plane of FIG. 5 when portion 30I has been molded onto engagement members 60.

Some protruding portions such as engagement member 68 may be formed without any edges that are parallel to edge 48. A portion of protruding portion 68 may be formed in the vicinity of opening 52 in insulating portion 30I of structure 30. For example, portion 68 may be formed close enough to opening 52 that the head of screw 36 (FIG. 2) exerts a force on insulating portion 301 directly over a portion of engagement member 68 (e.g., portion 68 may be partially formed under beveled edge 58). In this way, screw 36 may be supported in a direction parallel to the z-direction of FIG. 2 by part of metal portion 30M. Insulating material such as plastic may be insert-molded over portions 60 and 68 and into openings 62 to form insulating portion 30I of structure 30. However, the shape of protruding portions 60 and 68 is merely illustrative. If desired, other shapes and arrangements of protrusions along edge 48 may be used.

Figure 6:
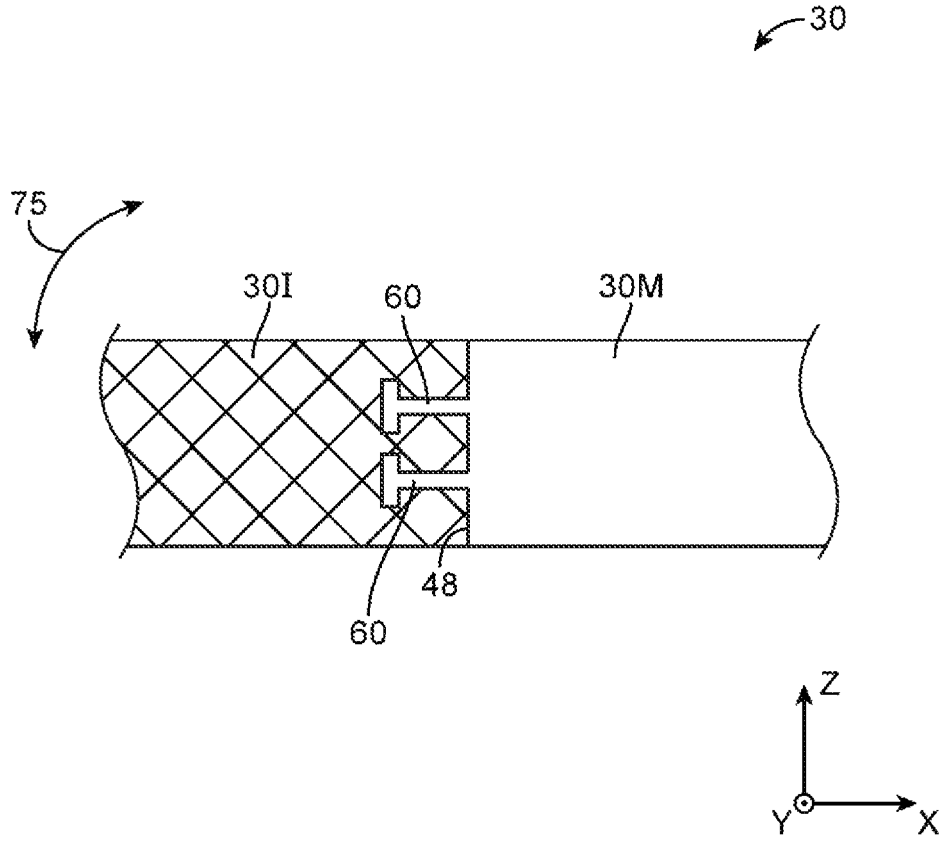
FIG. 6 is a cross-sectional side view of a portion of an illustrative insert-molded cowling structure showing how a plastic portion of the cowling may be insert molded onto vertically stacked engagement features in accordance with an embodiment of the present invention.

As shown in FIG. 6, multiple protruding portions 60 may be stacked on edge 48 in the z-direction of FIG. 6 in order to provide additional strength against twisting forces such as forces in directions indicated by arrows 75. In the example of FIG. 6, portions 60 each include a first section that extends in a direction that is perpendicular to the surface of edge 48 and a section that extends from the first section in a direction that is parallel to the surface of edge 48.

Figure 7:
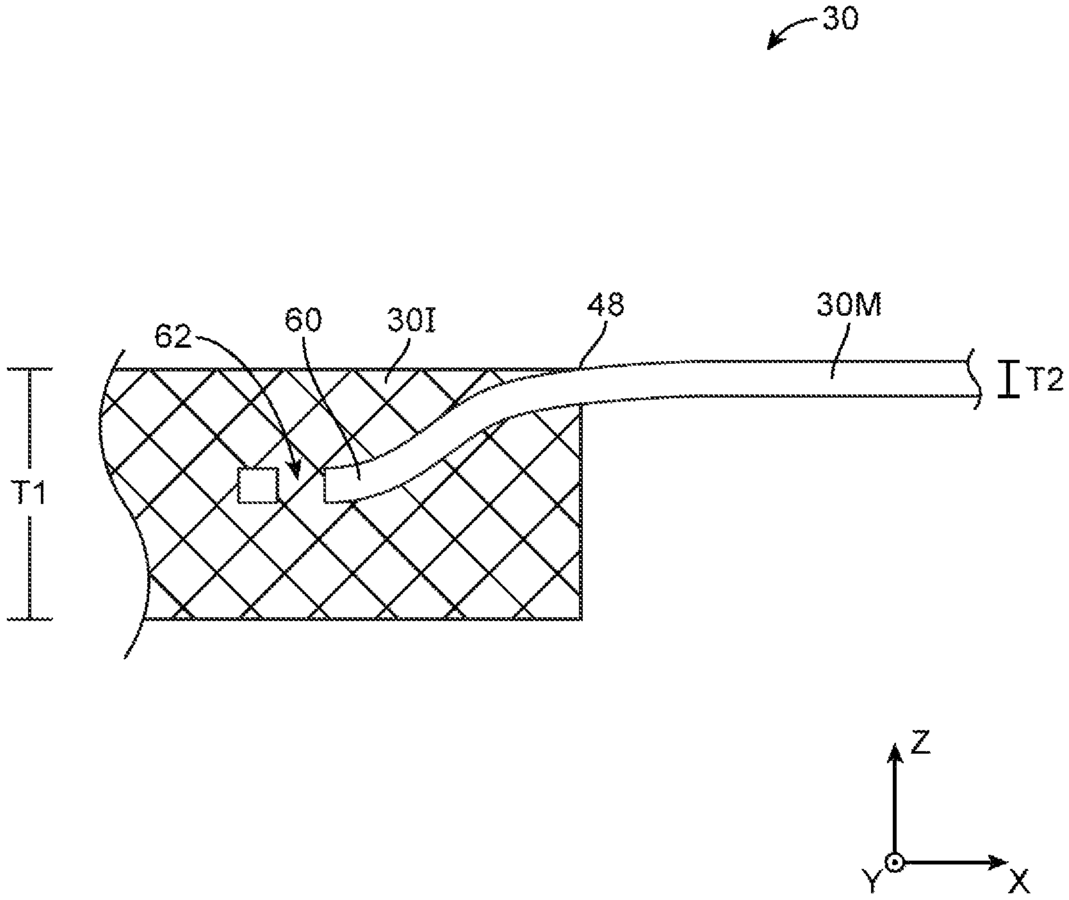
FIG. 7 is a cross-sectional side view of a portion of an illustrative insert-molded cowling structure showing how a plastic portion of the cowling may be insert molded onto curved engagement features in accordance with an embodiment of the present invention.

As shown in FIG. 7, protruding portions 60 of metal portion 30M may be curved or bent protruding portions that bend away from a planar surface of metal portion 30M. In the example of FIG. 7, insulating portion 301 has a thickness T1 that is substantially thicker than thickness T2 of metal portion 30M. However, this is merely illustrative. If desired, thickness T1 may be substantially the same as thickness T2. Bent engagement members such as engagement members 60 of FIG. 7 may also include openings 62 and angled edges as described above in connection with FIG. 5.

Figure 8:
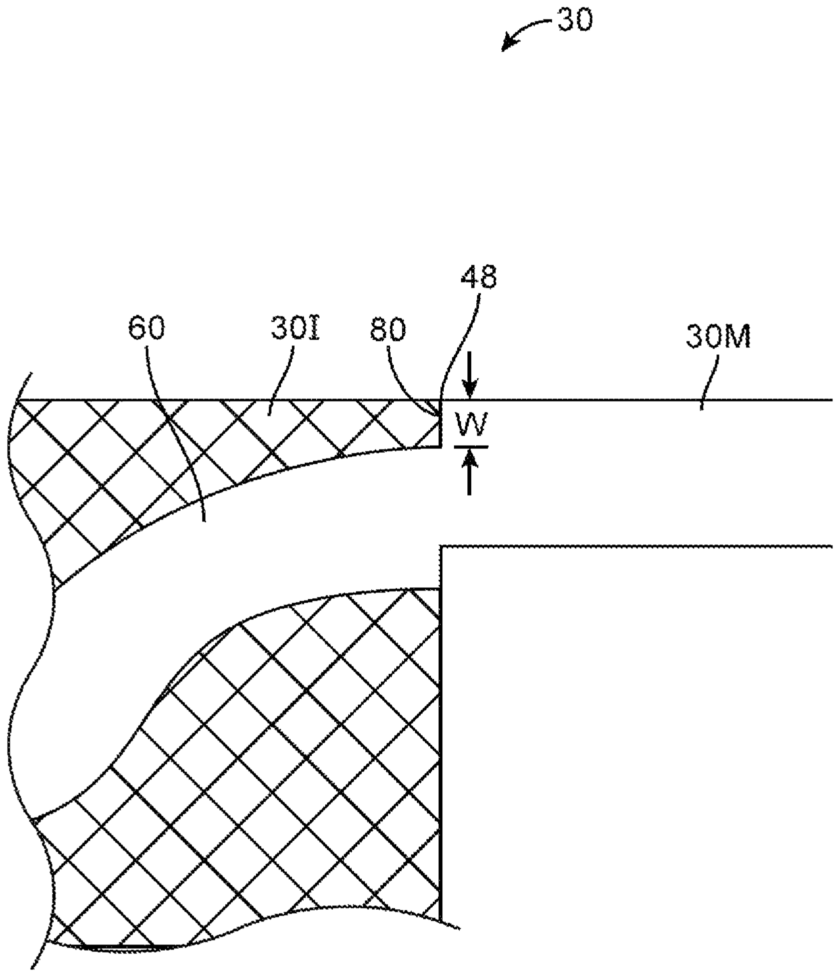
FIG. 8 is a cross-sectional side view of a portion of an illustrative metal portion of a cowling structure with a coined edge surface in accordance with an embodiment of the present invention.

In order to provide structure 30 with a consistent edge 48 in regions that include protrusions 60 or 68 and in regions that do not include protrusions, edge 48 may be a coined edge as shown in FIG. 8. Coined edge 48 may include a step at the interface of a planar region of metal portion 30M and a curved engagement member 60. Surface 80 of the step in coined edge 48 may have a width W of between 0.03 mm and 0.05 mm, between 0.1 mm and 0.6 mm, less than 1 mm, or greater than 0.01 mm (as examples). In this way, insulating material such as plastic that is insert molded onto engagement features 60 will be formed against surface 80 and form a clean consistent edge 48.

Figure 9:
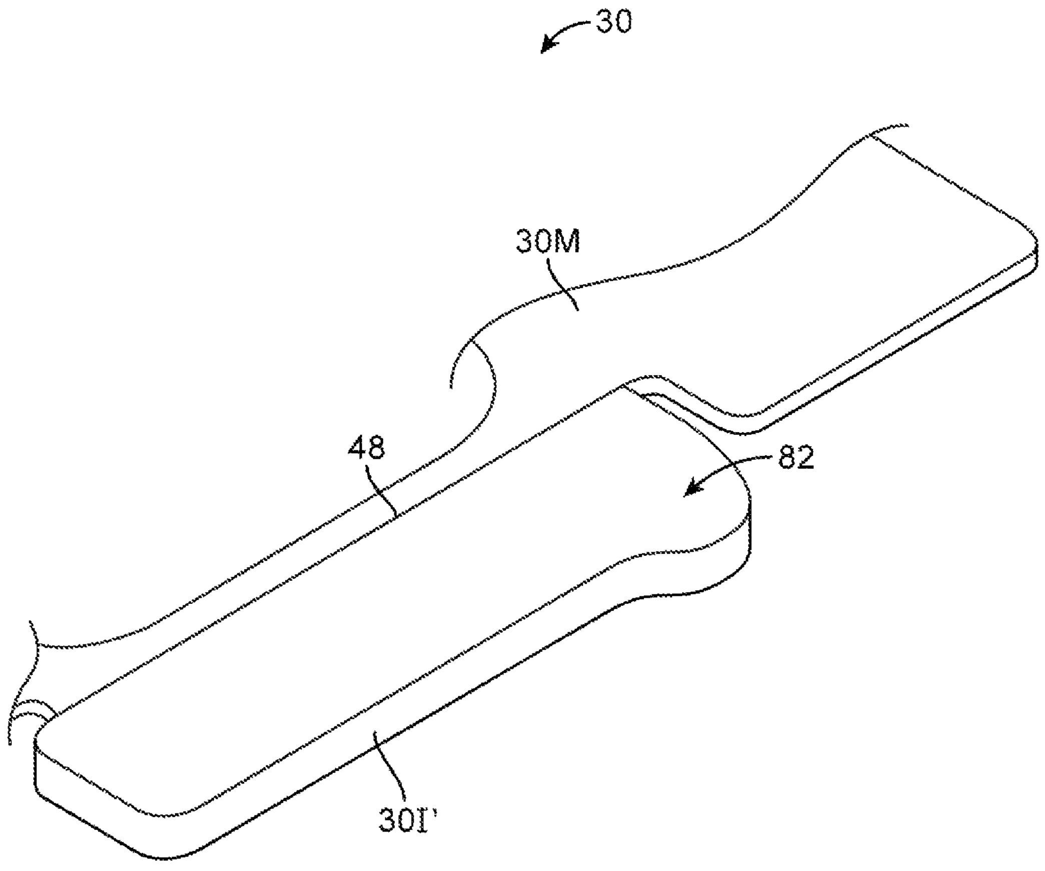
FIG. 9 is a diagram of a portion of an illustrative insert-molded cowling during manufacturing showing how an insert molded plastic portion of the cowling may be formed without any openings in accordance with an embodiment of the present invention.

FIG. 9 shows cowling structure 30 during formation of insert-molded insulating portion 30I along edge 48 of metal portion 30M. As shown in FIG. 9, portion 30I' may be formed without an opening 52 by injecting insulating material (e.g., plastic or glass filled plastic) into a mold at a gate point 82 at a location at which opening 52 will later be formed. Forming portion 30I' without any openings may help prevent injected material from colliding with itself near openings during injection operations and forming potential weak points in finished portion 30I.

Figure 10:
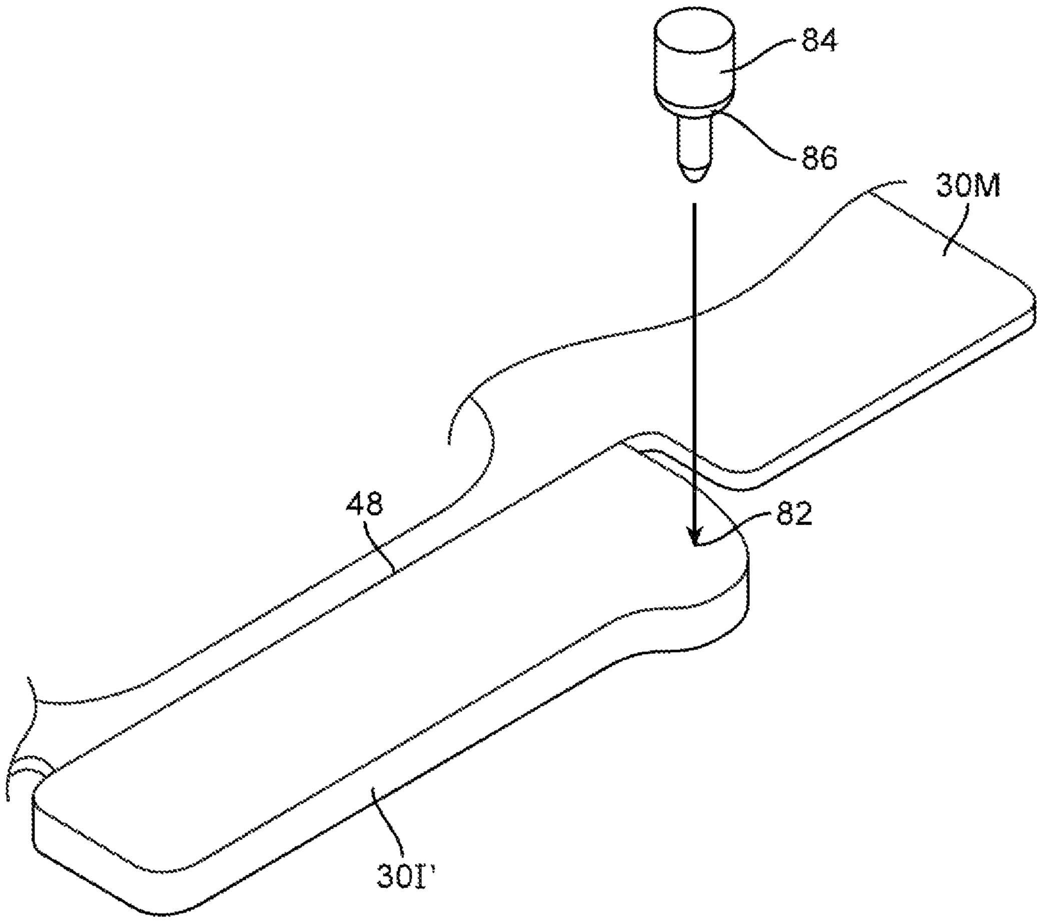
FIG. 10 is a diagram showing how an illustrative drilling tool may be used to form an opening such as a screw hole in an insert-molded plastic portion of a cowling structure in accordance with an embodiment of the present invention.

As shown in FIG. 10, an opening such as opening 52 (see, e.g., FIG. 3) may be formed in portion 30I' using a tool such as drill 84. Drill 84 may be used to drill an opening in portion 30I' at the location of gate point 82 that was used for injection of the insulating material. In this way, the injection mold gate may be removed in the same process in which opening 52 is formed for finished portion 30I.

Drill 84 may include an angled bit portion such as portion 86 for forming beveled edge 58 in opening 52.

Figure 11:
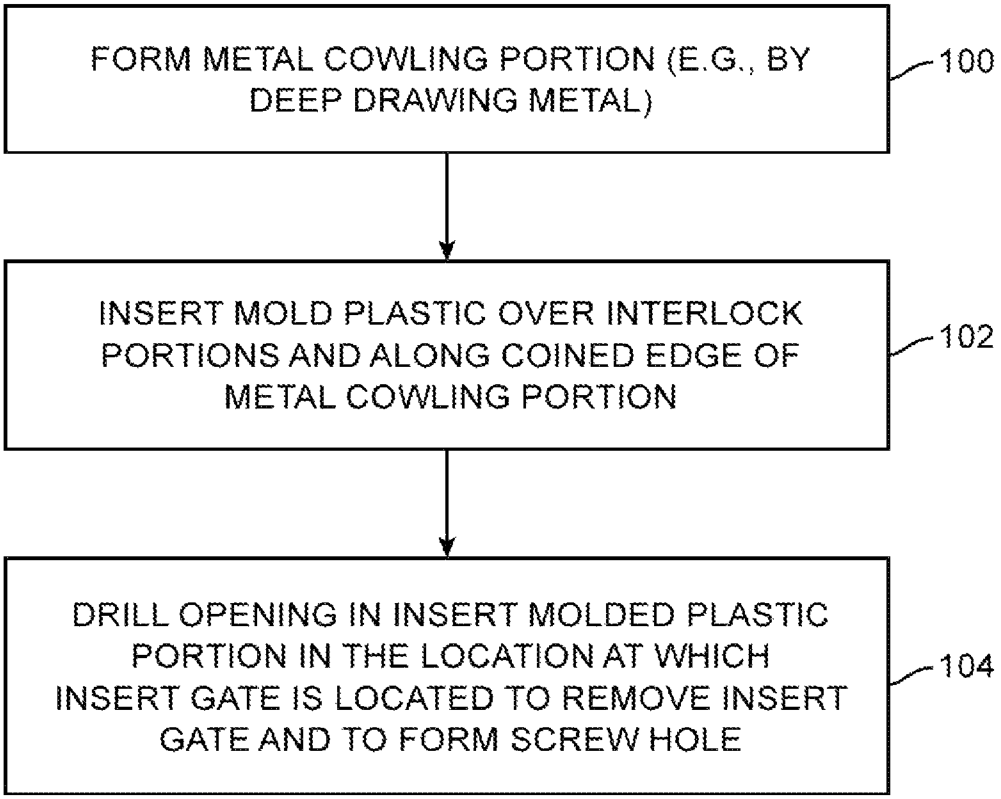
FIG. 11 is a flow chart of illustrative steps involved forming an insert-molded cowling structure in accordance with an embodiment of the present invention.

Illustrative steps that may be used in forming an insert-molded insulating portion such as portion 30I on a metal portion 30M of a cowling structure are shown in FIG. 11.

At step 100, a metal cowling structure may be formed using, for example, deep drawing operations. Deep drawing a metal cowling structure may include forming offset planar portions, extended portions, protrusions, and curved portions of a metal structure. Openings may also be formed in the metal cowling structure.

At step 102, insulating material such as plastic may be insert-molded onto interlock portions such as protruding engagement members on an edge of the metal cowling structure.

At step 104, an opening may be formed in the insert-molded insulating portion (e.g., by drilling an opening in the insert-molded insulating portion at the location at which an insert gate is located). In this way, the insert gate may be removed and a screw hole may be formed in the insert-molded insulating portion of the metal cowling structure in a single drilling operation.

Figure 12:
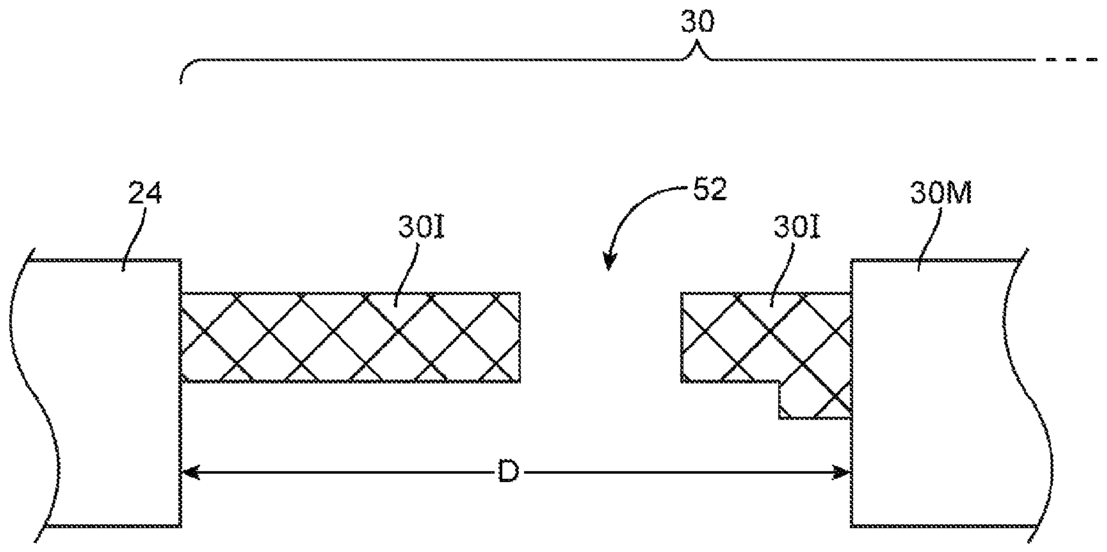
FIG. 12 is a cross-sectional side view of a portion of an illustrative insert-molded cowling structure showing how a plastic portion of the cowling may extend to an antenna structure in order to ensure that a metal portion of the cowling is mounted at a common distance from the antenna across many devices in accordance with an embodiment of the present invention.

If desired, insulating portion 301 of cowling structure 30 may be formed in contact with a communications circuitry element such as antenna 24 as shown in FIG. 12. In this way, metal portion 30M of cowling structure 30 may be formed at a consistent distance D (e.g., a distance equal to the width of insulating portion 30I) from antenna 24 in multiple devices. In this way, antennas 24 in tens, hundreds, thousands, hundreds of thousands, millions or more devices may be consistently placed at a common distance from metal support structures in an electronic device, thereby improving the consistency of wireless communications across devices.

The foregoing is merely illustrative of the principles of this invention and various modifications can be made by those skilled in the art without departing from the scope and spirit of the invention.

What is claimed is:

1. An electronic device, comprising:

a substrate;

an electronic component mounted against the substrate; and a support structure having a metal portion in contact with the electronic component that presses the electronic component against the substrate, wherein the metal portion comprises at least one engagement feature that extends into and is at least partially surrounded by an insert-molded insulating portion and wherein the insert-molded insulating portion extends laterally from the metal portion.

2. The electronic device, comprising:

a substrate;

an electronic component mounted against the substrate;

a support structure having a metal portion that presses the electronic component against the substrate and an insert-molded insulating portion that extends from the metal portion; and an antenna, wherein the insert-molded insulating portion extends from an edge of the metal portion toward the antenna.

3. The electronic device defined in claim 2, further comprising an attachment member secured to the substrate, wherein the insert-molded insulating portion comprises an opening, and wherein the attachment member includes a portion in the opening in the insert-molded insulating portion.

4. The electronic device defined in claim 3 wherein the attachment member comprises a metal screw and wherein the insert-molded insulating portion prevents the metal screw from forming an electrical contact with the metal portion.

5. The electronic device defined in claim 4, further comprising an additional attachment member secured to the substrate, wherein the metal portion comprises an opening, and wherein the additional attachment member includes a portion in the opening in the metal portion.

6. The electronic device defined in claim 5, further comprising an additional electronic component, wherein the metal portion presses the additional electronic component against the substrate.

7. The electronic device defined in claim 6 wherein the metal portion comprises an additional opening and wherein the additional electronic component includes a portion that is mounted within the additional opening in the metal portion.

8. The electronic device defined in claim 7 wherein the electronic component comprises a camera that receives light through the substrate.

9. The electronic device defined in claim 8 wherein the additional electronic device comprises a speaker that emits sound through an opening in the substrate.

10. The electronic device defined in claim 2 wherein the insert-molded insulating portion is formed in contact with the antenna.

11. The electronic device defined in claim 2 wherein the edge of the metal portion comprises a coined edge and wherein the insert-molded insulating portion has been insert molded against the coined edge.

12. The electronic device defined in claim 2 wherein the metal portion of the support structure comprises protrusions along the edge that support the insert-molded insulating portion.

13. The electronic device defined in claim 12 wherein at least one of the protrusions has an edge that is parallel to the edge of the metal portion and an edge that is formed at an acute angle with respect to the edge of the metal portion.

14. The electronic device defined in claim 12 wherein at least one of the protrusions includes an opening and wherein at least some of the insert-molded insulating portion is formed in the opening in the at least one of the protrusions.

15. The electronic device defined in claim 12 wherein at least one of the protrusions comprises a bent protrusion that curves away from a planar portion of the metal portion into the insert-molded insulating portion.

16. The electronic device defined in claim 15 wherein the protrusions along the edge comprise first and second protrusions, wherein each of the first and second protrusions comprises a first section that extends from the edge in a direction that is perpendicular to a surface of the edge and a second section that extends from the first section in a direction that is parallel to the surface of the edge.

17. An electronic device, comprising:

a substrate;

a first electronic component mounted against the substrate;

a second electronic component mounted against the substrate; and a support structure having a first metal portion that presses the first electronic component against the substrate, a second metal portion that presses the second electronic component against the substrate, and a plastic portion that is molded to the first metal portion, wherein the first metal portion is interposed between the second metal portion and the plastic portion.

18. The electronic device defined in claim 17, wherein the second metal portion comprises an opening and wherein at least a portion of the second electronic component is mounted in the opening.

19. The electronic device defined in claim 17, wherein the first electronic component comprises a camera and the second electronic component comprises a speaker.

20. The electronic device defined in claim 17, wherein the support structure comprises a bent portion interposed between the first metal portion and the second metal portion.

* * * * *